(12) United States Patent
Morimoto et al.

(10) Patent No.: US 6,492,696 B2
(45) Date of Patent: Dec. 10, 2002

(54) SEMICONDUCTOR DEVICE AND PROCESS OF MANUFACTURING THE SAME

(75) Inventors: Hidenori Morimoto, Tenri (JP);
Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/846,391

(22) Filed: May 2, 2001

(65) Prior Publication Data

US 2001/0039092 A1 Nov. 8, 2001

(30) Foreign Application Priority Data

May 2, 2000 (JP) ........................................ 2000-133752

(51) Int. Cl.[7] .................. H01L 29/76; H01L 29/94; H01L 31/062; H01L 31/113
(52) U.S. Cl. .................. 257/412; 257/413; 257/384
(58) Field of Search .................. 438/270, 303, 438/330, 336; 257/412, 413, 384, 382, 316, 315

(56) References Cited

U.S. PATENT DOCUMENTS

| 5,529,942 | A | * | 6/1996 | Hong et al. | .................. 438/270 |
| 5,639,678 | A | * | 6/1997 | Lee et al. | .................. 438/308 |
| 5,656,519 | A | * | 8/1997 | Mogami | .................. 438/230 |
| 5,686,736 | A | * | 11/1997 | Natsume | .................. 257/350 |
| 5,744,845 | A | * | 4/1998 | Sayama et al. | .................. 257/412 |
| 5,883,418 | A | * | 3/1999 | Kimura | .................. 257/412 |
| 6,008,111 | A | * | 12/1999 | Fushida et al. | .................. 438/584 |
| 6,184,085 | B1 | * | 2/2001 | Jeong | .................. 438/258 |
| 6,261,909 | B1 | * | 7/2001 | Gardner et al. | .................. 438/270 |

FOREIGN PATENT DOCUMENTS

| JP | 10-92949 | 4/1998 |
| JP | 11-40817 | 2/1999 |
| JP | 11-154749 | 6/1999 |

OTHER PUBLICATIONS

Watanabe, J. et al.; "Light Emission from Co–silicided Electrode with Leakage Current" Fujitsu Laboratories Ltd. Conference of the Japan Society of Applied Physics, 1996 Autumn, Summary II, p. 589.

* cited by examiner

Primary Examiner—John F. Niebling
Assistant Examiner—Walter L. Lindsay, Jr.
(74) Attorney, Agent, or Firm—Nixon & Vanderhye P.C.

(57) ABSTRACT

A semiconductor device comprises: gate electrode formed on a semiconductor substrate through the intervention of a gate insulating film; and a source/drain region provided with a silicide film on its surface and formed in the semiconductor substrate, wherein the source/drain region has an LDD region whose surface is partially or entirely tapered and an interface between the semiconductor substrate and the silicide film in the source/drain region is located higher than a surface of the semiconductor substrate below the gate electrode.

11 Claims, 5 Drawing Sheets

SEMICONDUCTOR DEVICE AND PROCESS OF MANUFACTURING THE SAME

CROSS-REFERENCE TO RELATED APPLICATION

This application is related to Japanese application No. 2000-133752 filed on May 2, 2000, whose priority is claimed under 35 USC § 119, the disclosure of which is incorporated by reference in its entirety.

BACKGROUND OF THE INVENTION

1. Field of the Invention

The present invention relates to a semiconductor device and a process of manufacturing the same. In particular it relates to a semiconductor device of an LDD structure comprising a MOS transistor in which a silicide film is provided at least on a surface of a source/drain region, and a process of manufacturing the same.

2. Description of Related Art

As integration of semiconductor integrated circuits progresses, MOS transistors comprising the circuits are required to be further miniaturized. For example, gate length typically in the order of submicron or half micron tends to become as small as 0.35 $\mu$m, 0.25 $\mu$m or 0.18 $\mu$m.

Smaller gate length is advantageous in high-speed operation. However, it causes short channel effect, reduction of threshold voltage (Vth) and decrease in dielectric strength at a source/drain region. Further, favorable contact holes of minuscule area and low resistance are required.

To inhibit the short channel effect, commonly known is a technique for forming a shallow source/drain region and utilizing an LDD (Lightly Doped Drain) structure. Further, also known is a method of forming a silicide film on the surfaces of a source/drain region and a gate electrode to reduce contact resistance.

However, according to the miniaturization of the gate length, the source/drain region tends to be shallower. For example, in the case where the gate length is 0.50 to 0.35 $\mu$m, the depth of the source/drain region is 200 to 150 nm, and in the case where it is 0.25 $\mu$m, the depth of the source/drain region is as extremely small as about 80 nm. Accordingly, where the silicide film is formed on such a shallow source/drain region, it is required to reduce an amount of the silicon substrate to be consumed by the formation of the silicide film. If the silicon substrate is consumed in a large amount, the silicide film will penetrate the source/drain region to reach a PN junction and break the PN junction.

For example, it has been reported that, when a cobalt silicide film is formed on the surface of the source/drain region of a transistor, a spike of about 100 nm in length is generated so as to extend along the source/drain region. Thereby leak current at the PN junction of the source/drain region is increased (cf. Conference of the Japan Society of Applied Physics, 1996 Autumn, Summary II, p589).

Accordingly, as shown in FIG. 2, a monocrystalline or polycrystalline silicon layer is selectively and epitaxially grown on a source/drain region 21. Then a titanium film is formed thereon and thermally treated to form a titanium silicide film 23 on the surface of the monocrystalline or polycrystalline silicon layer 22 (cf. Japanese Unexamined Patent Publication No. Hei 10 (1998)-92949). According to this method, silicon can be supplied by the monocrystalline or polycrystalline silicon layer 22 even if the silicon is largely consumed at the formation of the titanium silicide film 23, so that the titanium silicide film 23 is prevented from penetrating the source/drain region 21.

However, by the selective epitaxial growth of the monocrystalline or polycrystalline silicon layer 22 on the source/drain region 21, the monocrystalline or polycrystalline silicon layer 22 is also deposited on sidewall spacers 25 of a gate electrode 24. Therefore the titanium silicide film 23 is also formed on the sidewall spacers 25, which causes short circuit between the source/drain region 21 and the gate electrode 24.

Further, as shown in FIG. 3, there has been proposed a method of forming a source/drain region 33 of sufficient thickness by providing a gate electrode 31 in a recess of a silicon substrate 32 (e.g., see Japanese Unexamined Patent Publication No. Hei 11 (1999)-154749). According to this method, the source/drain region 33 is formed with a sufficient thickness so that penetration of a silicide film 34 through the source/drain region 33 is prevented.

However, in comparison with a MOS transistor formed on a flat silicon substrate, the thus formed transistor increases parasitic capacitance between the gate electrode 31 and the source/drain region 32, which harmfully influences on high-speed operation.

Still further, as shown in FIGS. 4(a) to 4(e), a method has been proposed by, e.g., Japanese Unexamined Patent Publication No. Hei 11 (1999)-40817 in which a LOCOS film 42 is formed on a surface silicon layer 41 of an SOI substrate (FIG. 4(a)), the LOCOS film 42 is etched away (FIG. 4(b)) to thin a channel region 43 (a recessed channel region; FIG. 4(c)), and then a metal film 45 is formed on the entire surface of the substrate (FIG. 4(d)) to form a silicide film 46 (FIG. 4(e)). Since this method utilizes the SOI substrate, the depth of a source/drain region 44 can be controlled by adjusting the thickness of the surface silicon layer 41. Accordingly the source/drain region 44 of relatively large depth can be formed by a common step for forming the source/drain region.

However, when this method is applied to a bulk substrate, diffusion of impurities in the source/drain region due to thermal treatment must be strictly controlled in order to adjust the depth of the source/drain region. Further, an additional step of forming the sidewall spacers on the gate electrode is required for the formation of an LDD region to prevent short channel effect and for the formation of the silicide film to prevent short circuit between the gate electrode and the source/drain region. Moreover, since a common step of forming the LDD region requires a thermal treatment for forming the source/drain region and another thermal treatment for forming the silicide film after ion implantation for forming the LDD region, the resulting LDD region is diffused too much in the lateral direction, which leads to insufficient prevention of the short channel effect.

SUMMARY OF THE INVENTION

The present invention has been achieved in view of the above-described problems. An object of the present invention is to provide a highly reliable semiconductor device in which short channel effect and short circuit are effectively inhibited by a relatively easy technique even if the semiconductor device includes an LDD region and a silicide film in the source/drain region, and a process of manufacturing the same.

According to the present invention, provided is a semiconductor device comprising: a gate electrode formed on a semiconductor substrate through the intervention of a gate insulating film; and a source/drain region provided with a silicide film on its surface and formed in the semiconductor substrate, wherein the source/drain region has an LDD region whose surface is partially or entirely tapered and an interface between the semiconductor substrate and the silicide film in the source/drain region is located higher than a surface of the semiconductor substrate below the gate electrode.

Further, according to the present invention, provided is a process of manufacturing a semiconductor device comprising the steps of: forming a LOCOS oxide film on a semiconductor substrate; partially removing the LOCOS oxide film to form a recess on the semiconductor substrate; burying a gate electrode in the recess through the intervention of a gate insulating film; performing ion implantation using the gate electrode and the remaining LOCOS oxide film as a mask to form a source/drain region; forming a silicide film at least on a surface of the source/drain region; and forming an LDD region in the semiconductor device below both sides of the gate electrode.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
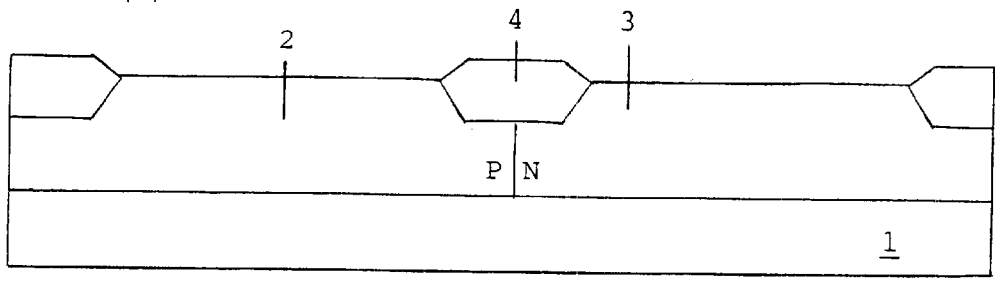
FIGS. 1(a) to 1(h) are schematic sectional views of a major part for illustrating an embodiment of a process of manufacturing a semiconductor device according to the present invention.

The semiconductor device according to the present invention is mainly comprised of a gate insulating film, a gate electrode and a source/drain region formed on a semiconductor substrate.

The semiconductor substrate applicable to the present invention is not limited as long as it is commonly used in the semiconductor memory devices. Examples thereof include substrates of element semiconductors such as silicon, germanium and the like and compound semiconductors such as GaAs, InGaAs, ZnSe and the like. Among them the silicon substrate is preferable. In the semiconductor substrate a device isolation region is preferably formed. The semiconductor substrate may further comprise elements such as transistors, capacitors and resisters, interlayer insulating films, circuits including them, semiconductor devices and the like. Preferably one or more p- or n-type impurity region (well) is formed in the semiconductor substrate. Further, the semiconductor substrate is preferably provided with a device isolation film. Examples thereof include a LOCOS oxide film, a trench device isolation film, an STI (Shallow Trench Isolation) film and the like, among which the LOCOS oxide film is preferable.

Examples of the gate insulating film include, e.g., a silicon oxide film, a silicon nitride film or a layered film thereof. The thickness thereof may be about 2 to 10 nm, for example.

The gate electrode is not particularly limited as long as it is formed of a conductive film. For example, it may be formed of a single-layered or multi-layered film of monosilicon, amorphous silicon, polysilicon; metal such as copper, aluminum and the like; refractory metal such as tungsten, tantalum, titanium, cobalt, platinum and the like; silicide with refractory metal; polycide or the like. Among them, preferable is polysilicon on its surface a silicide film, in particular with refractory metal is formed. The thickness of the gate electrode may be, for example, about 50 to 250 nm. Specifically, where the silicide film is formed on the surface of the gate electrode, the thicknesses of the silicide film/polysilicon may be about 20 to 100 nm/50 to 250 nm. The gate electrode is preferably formed in a recess formed in the surface of the semiconductor substrate to be mentioned later. In this case, the surface of the gate electrode may be on a level higher or lower than, or the same as the surface of the semiconductor substrate where the recess is not provided (a main surface), but preferably the gate electrode surface is arranged higher than the main surface.

The source/drain region is not particularly limited as long as it usually functions as a source/drain region of semiconductor devices. It may preferably be formed of a p- or n-type impurity diffusion layer provided in the semiconductor substrate. Conductivity type, kind and concentration of impurities to be implanted in the source/drain region, as well as the depth of the source/drain region may suitably be selected depending on the characteristics of the semiconductor device to be obtained.

The source/drain region is provided with an LDD region at an edge thereof near the gate electrode. The LDD region may be formed at one side only or both sides of the source/drain region symmetrically or asymmetrically. In particular symmetric LDD regions may preferably be formed at both sides of the source/drain region. The surface of the LDD region is partially or entirely tapered. In this context the term "tapered" signifies that the LDD region is partially or entirely inclined with respect to the main surface of the semiconductor substrate. The LDD region may be formed on an inclined surface of the semiconductor substrate; in the flat semiconductor substrate to have inclination by itself; or in the inclined semiconductor substrate to have inclination by itself. Impurity concentration of the LDD region is not particularly limited as long as the LDD region is arranged at the edge of the source/drain region while alleviating electric field and inhibiting short channel effect.

The source/drain region is provided with a silicide film on its surface. The silicide film may preferably be a silicide film with refractory metal and have a thickness of about 30 to 60 nm when the source/drain region has a depth of about 80 to 150 nm (a thickness of an impurity diffusion layer below the silicide film).

In the source/drain region, an interface between the semiconductor substrate and the silicide film is located higher than the surface of the semiconductor substrate below the gate electrode (a channel region). The level difference between the interface and the surface of the channel region is not particularly limited. Such a positional relationship is realized by epitaxially providing a semiconductor substrate material or depositing a semiconductor material film in a region for forming the source/drain region, or partially providing a recess in a region for forming the gate electrode (channel region) on the semiconductor substrate surface, or alternatively, combining the above-mentioned processes. However, it is preferable in view of convenience to partially etch a region to be the channel region in the semiconductor substrate surface to form the recess.

According to the process of manufacturing the semiconductor device of the present invention, first, a LOCOS oxide film is formed on the semiconductor substrate. The LOCOS oxide film, which determines the position of the channel region, is preferably disposed depending on the arrangement of the semiconductor device to be obtained. The LOCOS oxide film is provided by, for example, a so-called LOCOS method wherein a silicon oxide film and a silicon nitride film are formed on the entire surface of the semiconductor substrate, an opening of desired configuration is formed in the silicon nitride film and oxidized. The thickness of the LOCOS oxide film is not particularly limited, but for example, it may be about 100 to 300 nm. It is preferred to form a device isolation film on a desired region of the semiconductor substrate prior to the formation of the LOCOS oxide film on the semiconductor substrate. The device isolation film may be formed by a known method such as LOCOS, trench device isolation, STI or the like. Among them LOCOS is preferable. If the device isolation film is provided prior to the LOCOS oxide film, the thickness of the LOCOS oxide film is preferably smaller than that of the device isolation film.

Then, the LOCOS oxide film is partially removed to form a recess in the semiconductor substrate. For example, the partial removal of the LOCOS oxide film is performed for a central portion thereof, or a portion other than the bird's beak or a portion including a part of the bird's beak. Accordingly, the recess is provided in a region of the semiconductor substrate where the LOCOS oxide film has been formed and at least the bird's beak remains entirely or partially. The partial removal of the LOCOS oxide film is preferably carried out by, for example, anisotropic etching utilizing the silicon nitride film used for forming the LOCOS oxide film.

Further, the gate electrode is buried in the recess through the intervention of a gate insulating film. First, an insulating film is formed on the entire surface of the semiconductor substrate by a known method such as thermal oxidation, CVD or the like and then a gate electrode material is deposited thereon by a known method such as CVD, sputtering, vapor deposition or the like, which is then patterned or etched back so that the gate electrode is buried in the recess provided in the semiconductor substrate. In this case, it is preferable to utilize the silicon nitride film used for forming the LOCOS oxide film in the previous step to form the gate insulating film/the gate electrode material and then to perform etch back until the surface of the silicon nitride film is exposed. In this step, it may be possible to form the gate insulating film in advance only on the bottom of the recess and deposit the gate electrode material, which is then patterned/etched back. Further, after this step it is preferred to remove the silicon nitride film used to form the LOCOS oxide film.

Subsequently, ion implantation is performed using the gate electrode and the remaining LOCOS oxide film as a mask to form a source/drain region. The ion implantation is carried out at an implantation energy and a dose suitably selected depending on the thicknesses of the gate electrode and the remaining LOCOS oxide film. For example, n-type impurities such as phosphorus or arsenic are implanted at an implantation energy of about 15 to 40 keV and a dose of about 1 to $5 \times 10^{15}$ ions/cm$^2$. Alternatively, p-type impurities such as boron, BF$_2$ or the like are implanted at an implantation energy of about 20 to 50 keV and a dose of about 1 to $5 \times 10^{15}$ ions/cm$^2$.

Then, a silicide film is formed at least on the surface of the source/drain region. Where the gate electrode is made of silicon, the silicide film is formed not only on the surface of the source/drain region but also on the surface of the gate electrode. The silicide film is formed by a so-called salicide technique wherein a film of metal constituting the silicide film is deposited on the entire surface of the semiconductor substrate and thermally treated to form a metal silicide, and then unreacted metal film with silicon is removed. Alternatively it may be formed by a method of selectively introducing ions of metal constituting the silicide film into a region for forming the silicide film and performing thermal treatment. The film of metal constituting the silicide film may be formed by sputtering, vapor deposition, EB method or the like to have a thickness of about 20 to 50 nm. The thermal treatment may be performed with RTA at about 650 to 850° C. for about 1 to 2 minutes, about 10 to 50 seconds, or about 30 seconds. The removal of the unreacted metal film may be carried out by wet etching or the like using an acidic or alkaline solution. The selective introduction of the metal ions may be performed by ion implantation or the like. The thickness of the silicide film is not particularly limited, but for example, about 20 to 50 nm.

Then, LDD regions are formed in the semiconductor substrate under both sides of the gate electrode. The LDD regions may be formed by ion implantation, for example. The ion implantation may be performed in the presence of the remaining LOCOS oxide film, but preferably it is performed after the remaining LOCOS oxide film is removed. The ion implantation is carried out under an implantation energy and a dose suitably adjusted depending on the presence of the remaining LOCOS oxide film and the thickness of the remaining LOCOS oxide film, if present. For example, where n-type impurities such as phosphorus, arsenic or the like are implanted after the LOCOS oxide film is removed, an implantation energy of about 10 to 25 keV and a dose of about 2 to $5 \times 10^{12}$ ions/cm$^2$ are employed. Where p-type impurities such as boron, BF$_2$ or the like are implanted, an implantation energy of about 20 to 50 keV and a dose of about 2 to $5 \times 10^{12}$ ions/cm$^2$ are employed.

The removal of the remaining LOCOS oxide film is carried out, for example, by wet etching using an acidic or alkaline solution, sputtering, isotropic or anisotropic dry etching or the like. Among them dry etching is preferable. In the case where a-device isolation film has been provided in advance, it is preferable to perform etching with a resist mask having an opening only above the remaining LOCOS oxide film so that the device isolation film is not removed.

According to the present invention, surface treatment, thermal treatment, formation of an insulating film or a conductive film may optionally be performed before, during or after the above-mentioned steps. Further, one or two steps of forming interlayer insulating films, contact holes, wiring layers may be performed in combination after the above-mentioned series of steps to complete the semiconductor device.

Hereinafter, an embodiment of the process of manufacturing the semiconductor device according to the present invention will be detailed with reference to the drawings.

As shown in FIG. 1(a), first LOCOS oxide films 4 of about 400 nm thick are formed as device isolation films on a silicon substrate 1. Ion implantation is then performed to form a p-well region 2 and an n-well region 3.

Figure 1B:
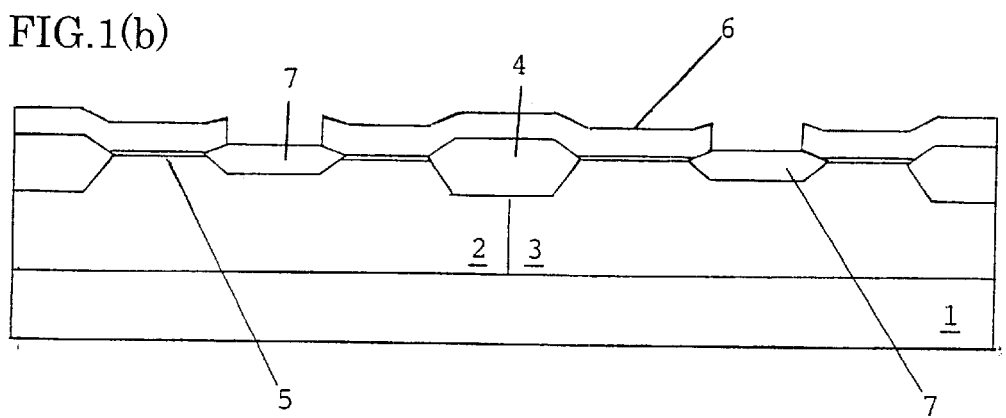

Then, on the entire surface of the silicon substrate 1 a silicon oxide film 5 of about 10 nm thick and a silicon nitride film 6 of about 100 nm thick are formed as shown in FIG. 1(b). The silicon nitride film 6 is patterned by photolithography and etching so that openings are formed above desired regions of the silicon substrate 1 between the first LOCOS oxide films 4. With the thus patterned silicon nitride film 6 as a mask, second LOCOS oxide films 7 are provided. The second LOCOS oxide film 7 is formed thinner than the first LOCOS oxide film 4. In accordance with the thickness of the second LOCOS oxide film 7, level difference between a source/drain region and a channel region to be formed in a later step is determined. At this stage, the thickness of the second LOCOS oxide film 7 is set to about 200 nm so that the level difference will finally be about 100 nm.

Figure 1C:
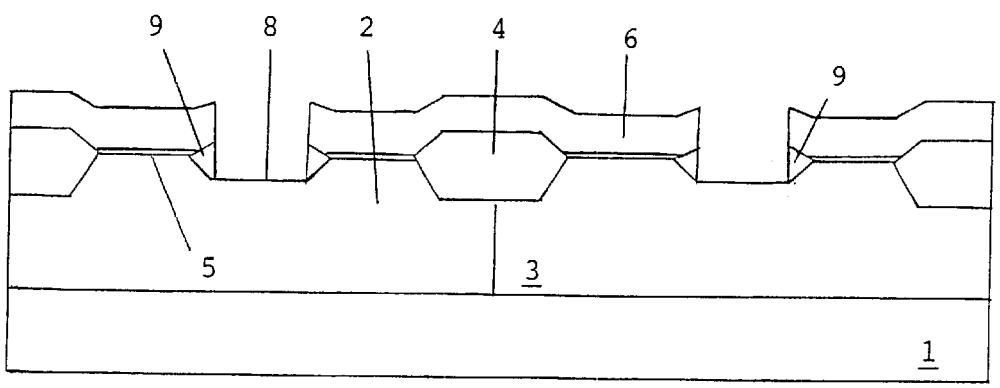

Then, as shown in FIG. 1(c), again with the silicon nitride film 6 as a mask, the second LOCOS oxide films 7 are anisotropically etched until the silicon substrate 1 is exposed. The thus exposed surface of the silicon substrate 1 will serve as channel region 8 in a later step. After this etching step, bird's beaks 9 at both sides of the second LOCOS oxide films 7 are not etched away and remain there. Thereafter, the channel regions 8 are sacrificially oxidized and then a sacrificial oxide film is removed by wet etching with a HF solution in order to remove damages caused by the etching.

Figure 1D:
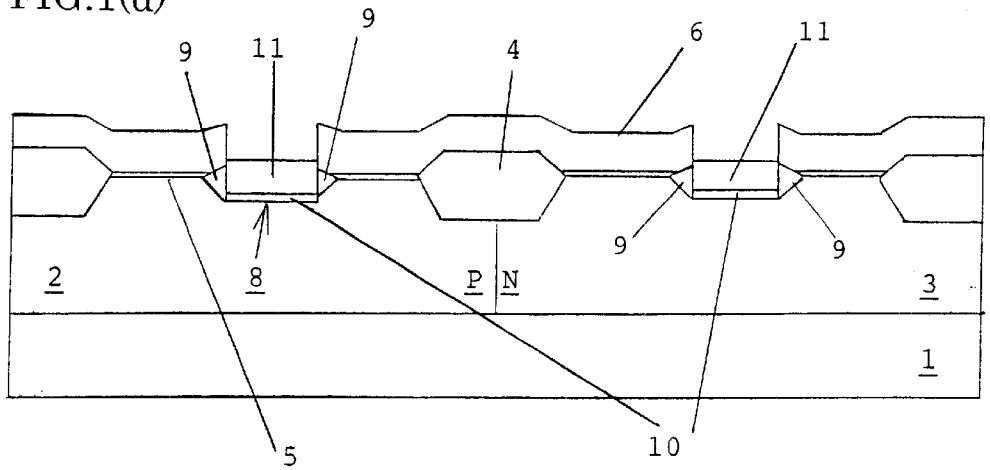

Then, as shown in FIG. 1(d), gate insulating films 10 of about 4.5 nm thick are formed on the channel regions 8 by thermal oxidation. Subsequently, a polysilicon layer of about 400 nm thick is deposited on the entire surface of the silicon substrate 1 where the silicon nitride film 6 has been formed and etched back until the polysilicon layer on the silicon nitride film 6 is completely removed. Then, gate electrodes 11 of about 200 nm thick are buried in the channel regions 8 without performing alignment for forming the gate electrodes.

Figure 1E:
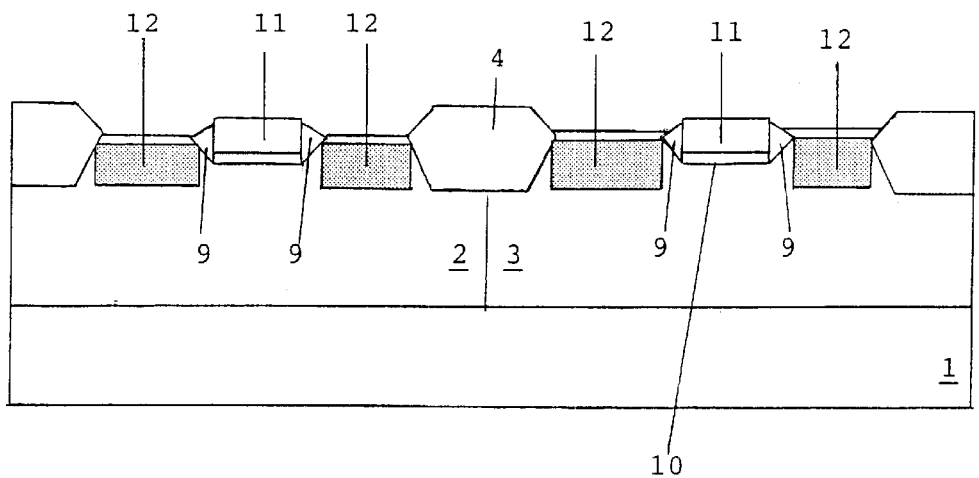

After removing the silicon nitride film 6, ion implantation of impurities is performed to the p-well region 2 and the n-well region 3, respectively using the gate electrodes 11 and the bird's beaks 9 as a mask and thermal treatment is performed under nitrogen atmosphere at 850° C. to form source/drain regions 12 as shown in FIG. 1(e). In the ion implantation step, the impurities are not implanted immediately below the bird's beaks 9.

Figure 1F:
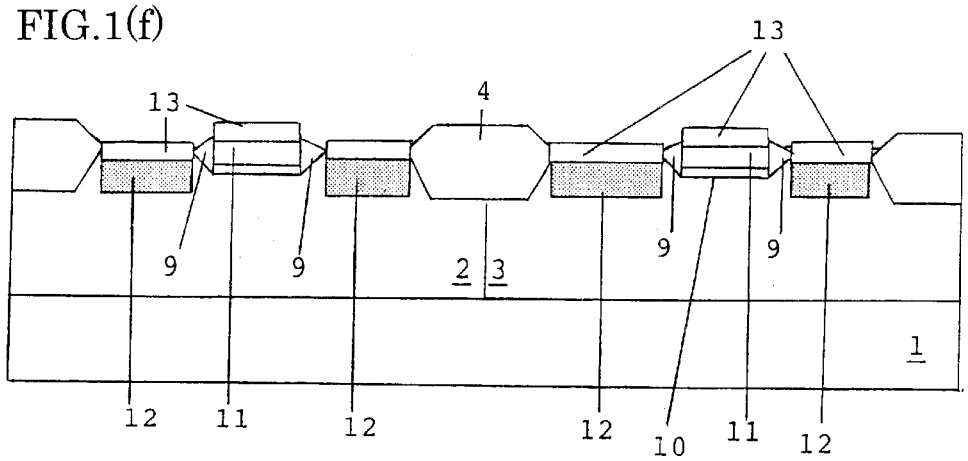

After removing the silicon oxide film 5 formed on the silicon substrate 1 with a HF solution, a cobalt film of about 20 nm thick is formed by sputtering on the entire surface of the silicon substrate I and thermally treated to form cobalt silicide films 13 of about 30 nm thick on the gate electrodes 11 and the source/drain regions 12 as shown in FIG. 1(f).

Thereafter, unreacted cobalt film is removed.

Figure 1G:
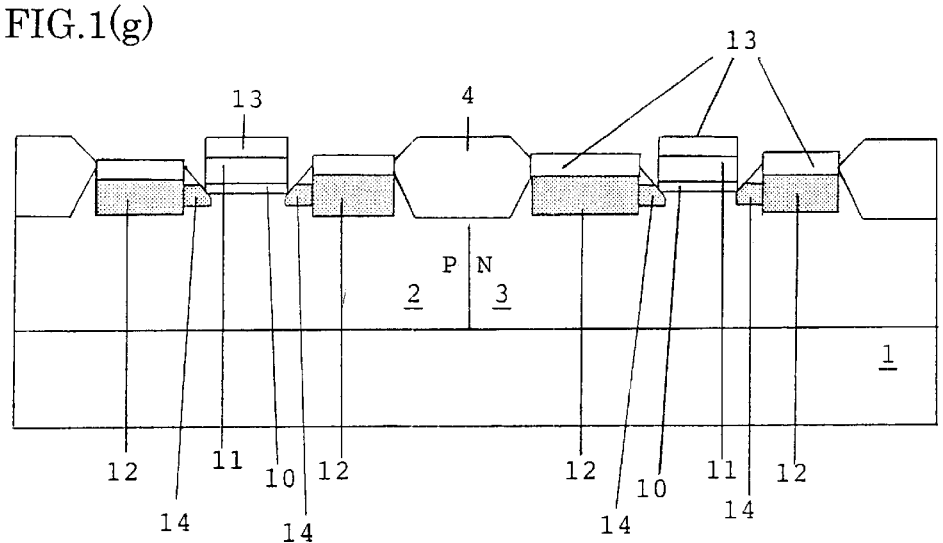

Subsequently, anisotropic etching is performed to the entire surface to remove the bird's beaks 9 as shown in FIG. 1(g) on conditions that the silicide films 13 will not be etched. With the gate electrodes 11 as a mask, impurities are implanted at low concentration to form LDD regions 14 as shown in FIG. 1(g).

Figure 1H:
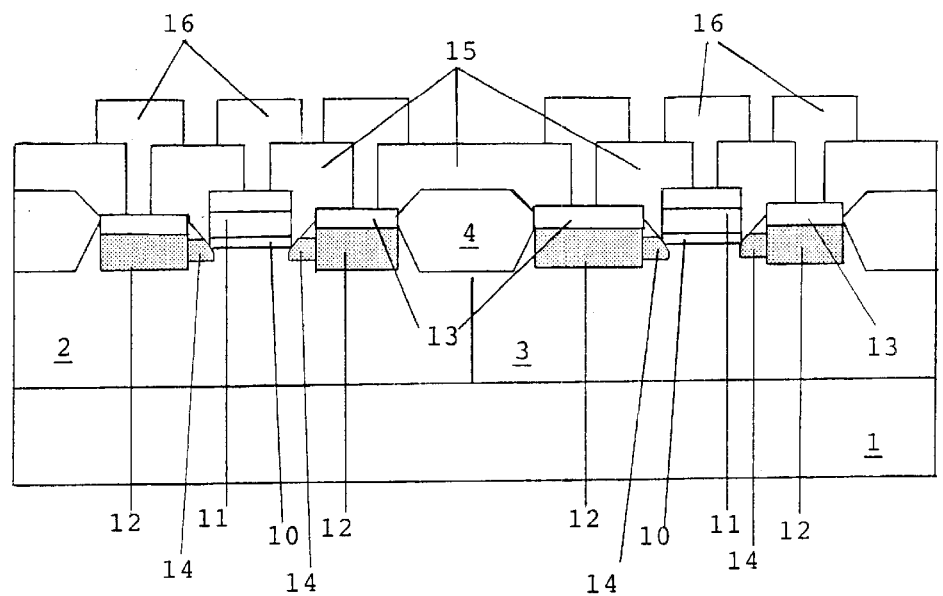
Figure 2:
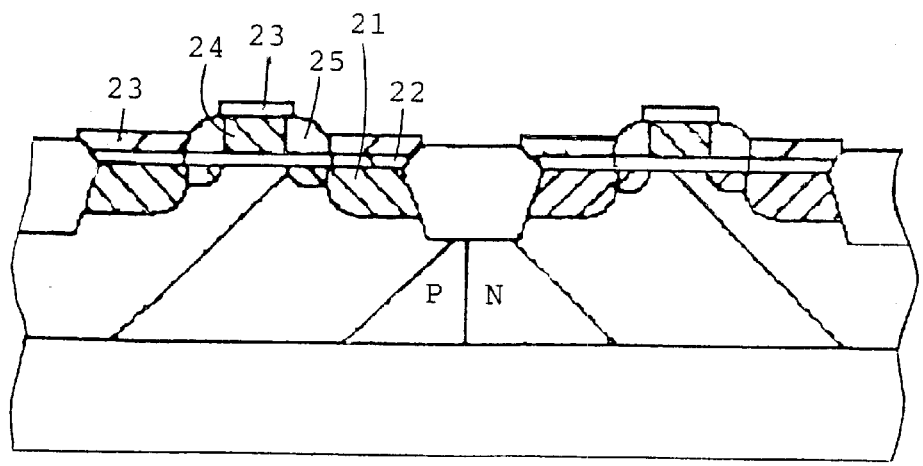
FIG. 2 is a schematic sectional view of a major part for illustrating a process of manufacturing a semiconductor device according to the prior art.
Figure 3:
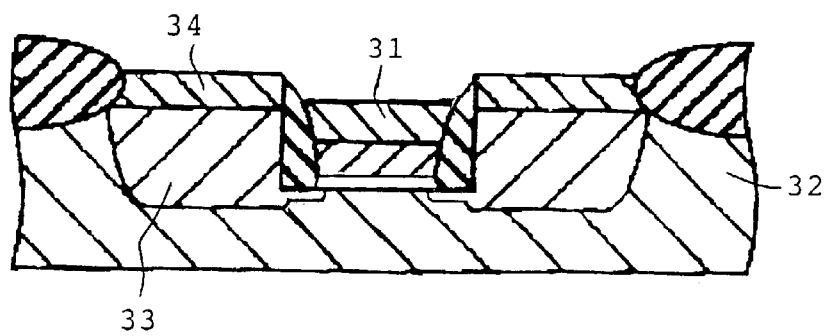
FIG. 3 is a schematic sectional view of a major part for illustrating another process of manufacturing a semiconductor device according to the prior art.
Figure 4A:
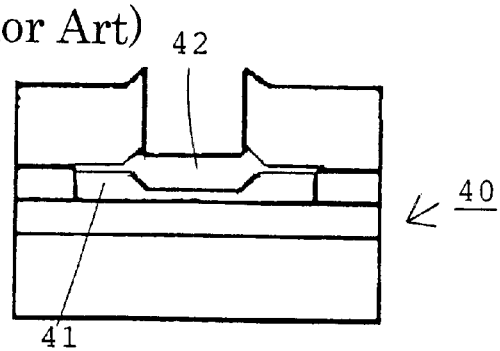
FIGS. 4(a) to 4(e) are schematic sectional views of a major part for illustrating still another process of manufacturing a semiconductor device according to the prior art.
Figure 4B:
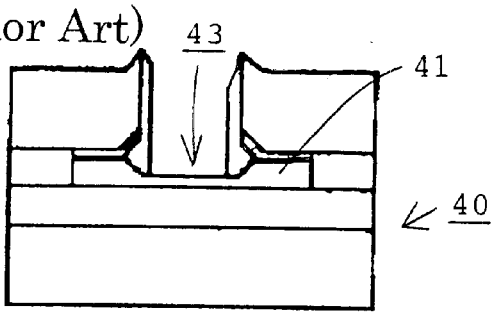
Figure 4C:
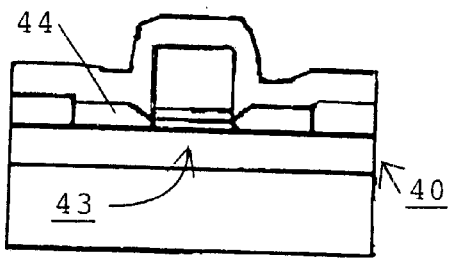
Figure 4D:
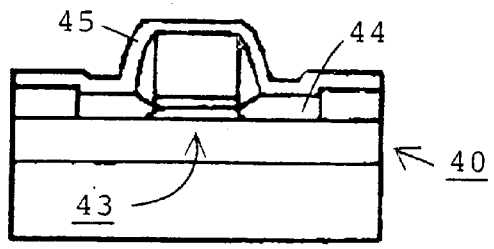
Figure 4E:
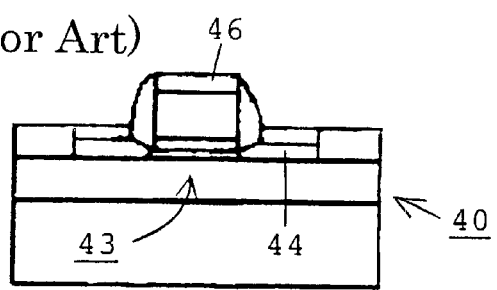

Then, a silicon oxide film 15 of about 800 nm thick is formed by CVD on the silicon substrate 1. Then, contact holes are formed in the silicon oxide film 15 by photolithography and etching and wiring layers 16 are formed. Thus, the semiconductor device is completed as shown in FIG. 1(h).

In the semiconductor device thus obtained, the silicide films 13 are provided on the surfaces of the gate electrodes 11 and the source/drain regions 12. Further, the surfaces of the LDD regions 14 are partially tapered and an interface between the source/drain region 12 and the silicide film 13 can be located higher than the surface of the semiconductor substrate immediately below the gate electrode 11. Accordingly, the source/drain region 12 can surely be formed thicker to some extent than the channel region 8. Therefore, leak current due to the silicide film 13 is prevented, which allows obtaining a highly reliable semiconductor device.

According to the process of manufacturing the semiconductor device described above, since the LDD region 14 is formed after the thermal treatment at 850° C. for forming the source/drain region 12, undesired diffusion of impurities in the LDD region 14 in a lateral direction can be prevented, which ensures inhibition of short channel effect.

Further, since the LDD region 14 can be formed while using the bird's beak 9 as a mask, an extra step of forming sidewall spacers commonly used for forming the LDD region can be omitted, which allows simplification of the manufacturing steps.

With respect to the formation of the silicide film 13, since the bird's beak 9 covers almost completely the sidewalls of the gate electrode 11, the silicide film 13 is not formed between the gate electrode 11 and the source/drain region 12, so that short circuit therebetween is prevented.

According to the semiconductor device of the present invention, since the source/drain region has an LDD region whose surface is partially or entirely tapered and an interface between the semiconductor substrate and the silicide film in the source/drain region is located higher than a surface of the semiconductor substrate below the gate electrode, electric field concentration and short channel effect are inhibited by the LDD region. Further, the source/drain region is provided with the silicide film formed on its surface and has a sufficient thickness as compared with the channel region, which allows prevention of increase in leak current at a PN junction. Thus, a highly reliable semiconductor device can be obtained.

Further, according to the process of manufacturing the semiconductor device of the present invention, a LOCOS oxide film is formed on a semiconductor substrate; the LOCOS oxide film is partially removed to form a recess on the semiconductor substrate; a gate electrode is buried in the recess through the intervention of a gate insulating film; ion implantation is performed using the gate electrode and the remaining LOCOS oxide film as a mask to form a source/drain region; a silicide film is formed at least on a surface of the source/drain region; and an LDD region is formed in the semiconductor substrate below both sides of the gate electrode. Accordingly, the gate electrode can be formed in self-alignment into the recess formed on the surface of the semiconductor substrate and variation in gate length is inhibited. Further, the source/drain region can be formed to have a sufficient thickness as compared with the channel region, the silicide film is prevented from approaching the PN junction in the source/drain region and increase in leak current at the PN junction is inhibited.

Still further, since the remaining LOCOS oxide film is used in place of the sidewall spacers, the step of forming the sidewall spacers is omitted and the short circuit between the gate electrode and the source/drain region can surely be prevented. Accordingly the manufacturing steps are simplified.

Moreover, since the LDD region is formed after the formation of the source/drain region and the silicide film, the LDD region is not subjected to other thermal treatments than that performed for forming the LDD region, which inhibits lateral diffusion of low concentration impurities in the LDD region. Thus, even if miniaturization progresses further, a process of manufacturing a highly reliable semiconductor device is provided without leading to increase of short channel effect.

In particular, in the case where the LOCOS oxide film removed by anisotropic etching while partially or entirely leaving the bird's beak, or in the case where the remaining LOCOS oxide film is removed after the formation of the silicide film before the formation of the LDD region, the formation of the LDD region is carried out more suitably and conveniently, which allows simplification of the manufacturing steps and reduction of manufacturing costs.

What is claimed is:

1. A semiconductor device comprising: a gate electrode formed on a semiconductor substrate through the intervention of a gate insulating film; and a source/drain region provided with a suicide film on its surface and formed in the semiconductor substrate, wherein the source/drain region has an LDD region whose surface is partially or entirely tapered and an interface between the semiconductor substrate and the silicide film in the source/drain region is located higher than a surface of the semiconductor substrate below the gate electrode.

2. A semiconductor device according to claim 1, wherein the gate electrode is provided over a recess defined in the semiconductor substrate, and wherein the upper surface of the gate electrode is located at an elevation higher than the upper surface of the semiconductor substrate where the recess is not provided.

3. A semiconductor device according to claim 1, wherein the gate electrode is provided over a recess defined in the semiconductor substrate, and wherein an upper or side surface of the LDD region is partially or entirely inclined with respect to the upper surface of the semiconductor substrate where the recess is not provided.

4. A semiconductor device according to claim 1, wherein the LDD region is formed on an inclined surface of the semiconductor substrate.

5. A semiconductor device according to claim 1, further comprising a LOCOS oxide film for providing isolation.

6. A semiconductor device comprising:
a gate electrode formed on a semiconductor substrate;
a source and/or drain provided with a silicide film on its upper surface, the source and/or drain being formed in the semiconductor substrate by impurity implantation,
wherein the source and/or drain includes an LDD region whose surface is at least partially tapered, and
wherein an interface between an upper surface of the source and/or drain and the silicide film on its upper surface is located at an elevation higher than an upper surface of the semiconductor substrate below the gate electrode.

7. A semiconductor device according to claim 6, wherein the gate electrode is provided over a recess defined in the semiconductor substrate, and wherein the upper surface of the gate electrode is located at an elevation higher than the upper surface of the semiconductor substrate where the recess is not provided.

8. A semiconductor device according to claim 6, the LDD region is formed on an inclined surface of the semiconductor substrate.

9. A semiconductor device according to claim 6, wherein the silicide film is provided on respective upper surfaces of both the source and drain.

10. A semiconductor device according to claim 1, wherein the silicide film is provided on respective upper surfaces of both the source and drain regions.

11. A semiconductor device according to claim 1, wherein an upper surface of the LDD region is inclined, irrespective of the shape of the surface of the underlying substrate.

* * * * *